(12) United States Patent
Liao et al.

(10) Patent No.: US 10,651,053 B2
(45) Date of Patent: May 12, 2020

(54) EMBEDDED METAL INSULATOR METAL STRUCTURE

(71) Applicant: Taiwan Semiconductor Manufacturing Co., Ltd., Hsinchu (TW)

(72) Inventors: Wen-Shiang Liao, Miaoli County (TW); Chewn-Pu Jou, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 2 days.

(21) Appl. No.: 15/963,725

(22) Filed: Apr. 26, 2018

(65) Prior Publication Data

US 2019/0157108 A1  May 23, 2019

Related U.S. Application Data

(60) Provisional application No. 62/589,849, filed on Nov. 22, 2017.

(51) Int. Cl.
*H01L 21/48* (2006.01)
*H01L 23/31* (2006.01)
(Continued)

(52) U.S. Cl.
CPC ........ *H01L 21/4857* (2013.01); *H01L 21/486* (2013.01); *H01L 21/4853* (2013.01); *H01L 21/6835* (2013.01); *H01L 23/49822* (2013.01); *H01L 23/49827* (2013.01); *H01L 28/40* (2013.01); *H01L 28/60* (2013.01); *H01L 23/3128* (2013.01); *H01L 2221/68345* (2013.01); *H01L 2221/68359* (2013.01)

(58) Field of Classification Search
CPC .............. H01L 21/4857; H01L 21/486; H01L 23/49827; H01L 23/5223; H01L 23/5226; H01L 23/5389; H01L 27/0805; H01L 28/40; H01L 28/60; H01L 28/90; H01L 2924/19041; H01L 2924/19105
See application file for complete search history.

(56) References Cited

U.S. PATENT DOCUMENTS

| | | | |
|---|---|---|---|
| 9,343,237 B2 | 5/2016 | Cho et al. | |
| 2010/0230806 A1* | 9/2010 | Huang | H01L 23/50 257/723 |

(Continued)

*Primary Examiner* — David C Spalla
(74) *Attorney, Agent, or Firm* — Sterne, Kessler, Goldstein & Fox P.L.L.C.

(57) ABSTRACT

The present disclosure describes a method of forming a metal insulator metal (MIM) decoupling capacitor that can be integrated (or embedded) into a 3D integrated circuit package such as, for example, a chip-on-wafer-on-substrate (CoWoS) chip package or an integrated fan-out (InFO) chip package. For example, the method includes providing a glass carrier with a protective layer over the glass carrier. The method also includes forming a capacitor on the protective layer by: forming a bottom metal layer on a portion of the protective layer; forming one or more first metal contacts and a second metal contact on the bottom metal layer, where the one or more first metal contacts have a width larger than the second metal contact; forming a dielectric layer on the one or more first metal contacts; and forming a top metal layer on the dielectric layer.

20 Claims, 15 Drawing Sheets

(51) Int. Cl.
    *H01L 23/498*     (2006.01)
    *H01L 49/02*     (2006.01)
    *H01L 21/683*     (2006.01)

(56) References Cited

U.S. PATENT DOCUMENTS

| | | | |
|---|---|---|---|
| 2014/0042547 A1* | 2/2014 | Khakifirooz | H01L 27/0805 257/368 |
| 2017/0186752 A1* | 6/2017 | Choi | H01L 21/0223 |
| 2018/0190761 A1* | 7/2018 | Chiang | H01L 28/90 |
| 2018/0337122 A1 | 11/2018 | Liao et al. | |

\* cited by examiner

EMBEDDED METAL INSULATOR METAL STRUCTURE

CROSS-REFERENCE TO RELATED APPLICATION

This application claims the benefit of U.S. Provisional Patent Application No. 62/589,849, titled "EMBEDDED METAL INSULATOR METAL STRUCTURE," which was filed on Nov. 22, 2017 and is incorporated herein by reference in its entirety.

BACKGROUND

Decoupling capacitors can be built into chips to prevent voltage spikes in a power supply such as, for example, when the chip is initially powered or when various components of the chip are activated. In the chip fabrication process, decoupling capacitors can be integrated in the far back end of the line during or after packaging of the chip.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
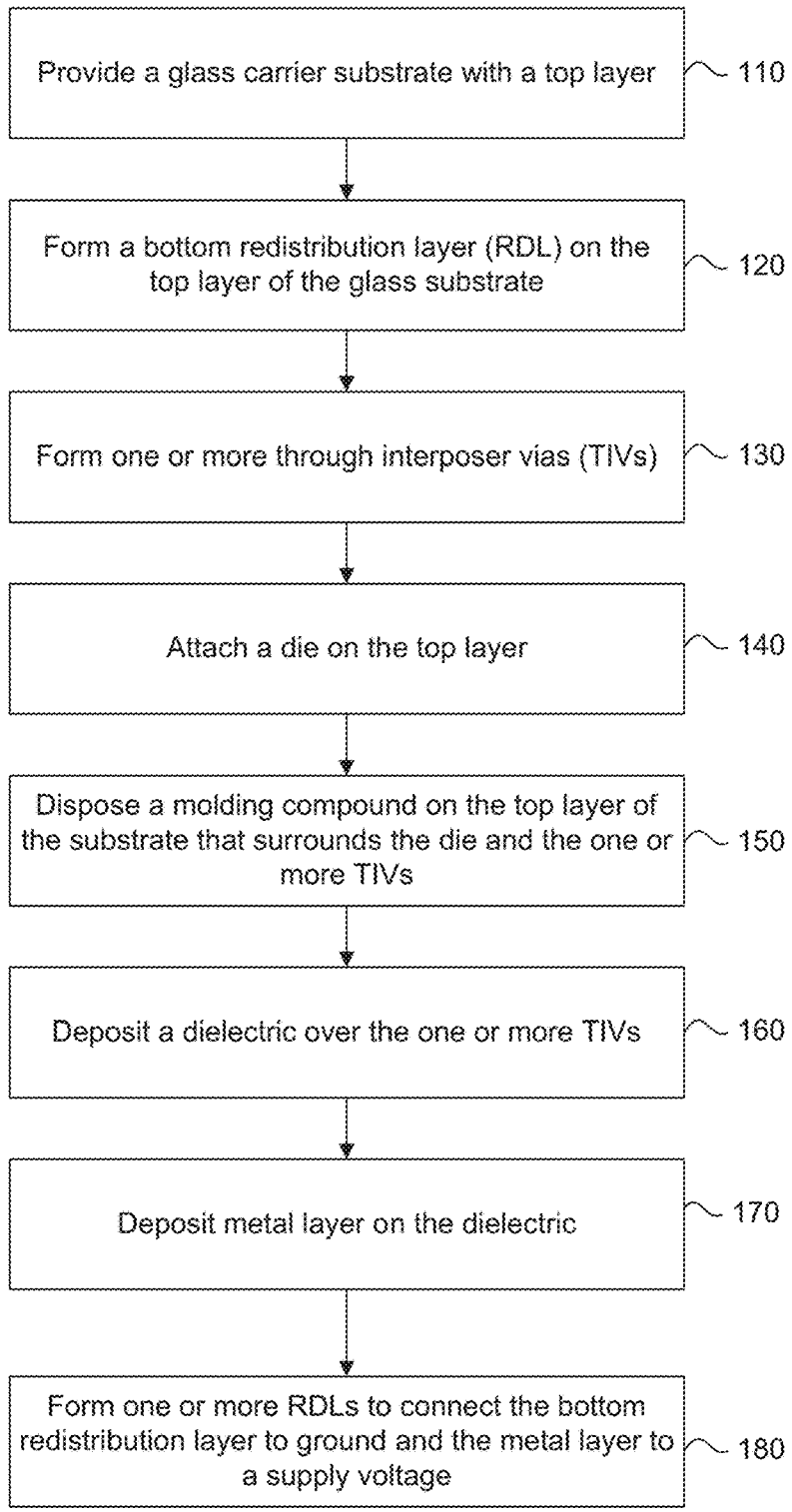
FIG. 1 is a flow chart diagram of an exemplary fabrication process that describes the formation of an exemplary metal insulator metal (MIM) capacitor embedded in an integrated fan-out (InFO) packaging, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "vertical," as used herein, means nominally perpendicular to the surface of a substrate.

Decoupling capacitors (DeCAP) can be built into chips to prevent voltage spikes in a power supply such as, for example, when the chip is initially powered or when various components of the chip are activated. Since the power supply cannot instantaneously respond to such power demand changes, the chip's power voltage can change for a brief period until the power supply can respond and stabilize the voltage. Voltage spikes may occur during this transient time. Decoupling capacitors can suppress these voltage spikes. Spike suppression performance can improve with decoupling capacitors that feature higher capacitance.

In a chip fabrication process, decoupling capacitors can be integrated in the far back end of the line during or after packaging of the chip. Decoupling capacitors, for example, can be surface mounted onto a packaging substrate using a surface-mount technology (SMT). However, SMT requires long external interconnects between the packaging substrate and the decoupling capacitors, which are mounted externally. External interconnects or connections can increase time delay, for example the delay between a spike occurrence and spike suppression. The embodiments described herein are directed to a method of forming a decoupling capacitor that can be integrated into a 3D integrated circuit (IC) packaging such as, for example, a chip-on-wafer-on-substrate (CoWoS) chip package or an integrated fan-out (InFO) chip package. Integrating the decoupling capacitor into the 3D IC packaging has the benefit of internal interconnects, which are shorter than external interconnects. CoWoS and InFO chip packages can integrate multiple functional dies onto an interposer with a space allocated between each die so that input/output (I/O) connection points can be formed. In some embodiments, the decoupling capacitor formed as part of an interposer of a CoWoS and InFO chip package is a metal insulator metal (MIM) structure that can include a high dielectric constant (high-k) insulator (e.g., dielectric constant higher than 3.9). Compared to decoupling capacitors mounted on substrates using the SMT technology, an integrated MIM capacitor—according to embodiments described herein—can (i) reduce time delay due to a shorter interconnect length, (ii) have a higher capacitance and a larger capacitance range, (iii) reduce power consumption, (iv) improve operational speed, and (v) reduce packaging footprint.

FIG. 1 is a flow chart of an exemplary method 100 that describes the fabrication of an MIM decoupling capacitor embedded in an InFO 3D IC packaging, according to some embodiments. Other fabrication operations may be performed between the various operations of exemplary method 100 and may be omitted merely for clarity. This exemplary MIM decoupling capacitor formation method is not limited to method 100. For example purposes, method 100 will be described in the context of InFO 3D IC packaging. However, exemplary method 100 can be also applied to types of packaging such as, for example, CoWoS 3D IC packaging. These other types of packaging are within the spirit and scope of this disclosure.

The figures provided to describe method 100 are for illustrative purposes only and are not to scale. In addition, the figures may not reflect the actual geometry of the real structures, features, or films. Some structures, films, or geometries may have been deliberately augmented for illustrative purposes.

Figure 2:
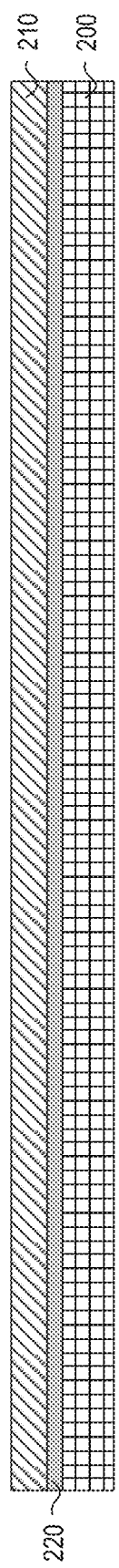
FIG. 2 is a cross-sectional view of a glass carrier with a top protective layer, according to some embodiments.

Exemplary fabrication method 100 starts with operation 110, where a glass carrier substrate 200 is provided with a top protective layer 210, as shown in FIG. 2. In some embodiments, glass carrier substrate 200 provides support to the structural elements that will be attached or built in subsequent operations. By way of example and not limitation, top protective layer 210 can be a polyimide (PI) or a polybenzoxazole (PBO) material. Top protective layer 210 (also referred to herein as "PBO layer 210") is a stress relief coating used as a protective layer or a "buffer coat" prior to the formation of a redistribution layer (RDL). In some embodiments, a light to heat convention layer (LTHC) 220 is sandwiched between glass carrier substrate 200 and PBO layer 210. LTHC 220 is an adhesive layer that can be cured with ultra-violet (UV) light to create a temporary bond between top protective layer 210 and glass carrier substrate 200. This temporary bond can be broken to separate PBO layer 210 from glass carrier substrate 200 after the completion of the InFO packaging formation process. By way of example and not limitation, irradiation of LTHC 220 with a focused laser beam, through the back-side of glass carrier substrate 200, can generate sufficient heat to decompose LTHC 200 and release glass carrier substrate 200 from PBO layer 210. For this release, carrier substrate 200 is transparent to a light source that can irradiate and decompose LTHC 220.

Figure 3:
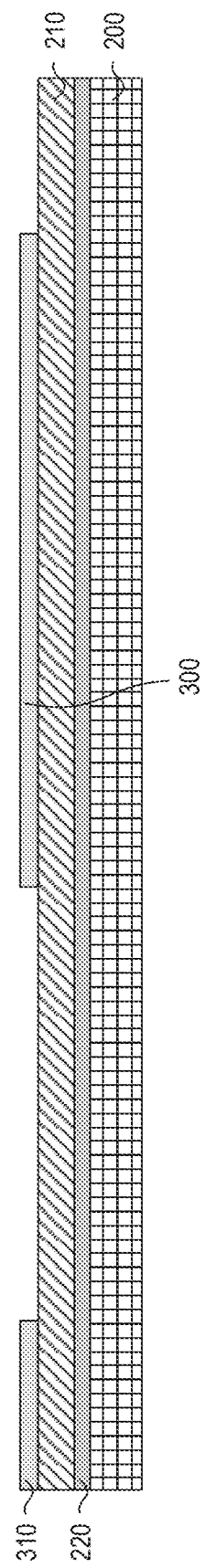
FIG. 3 is a cross-sectional view of a glass carrier with a top protective layer after formation of a redistribution layer (RDL), according to some embodiments.

In operation 120 of exemplary method 100, and referring to FIG. 3, a bottom RDL can be formed over PBO layer 210. The bottom RDL may include metal line 300 and metal line 310. In some embodiments, the RDL can include metal lines formed from patterned metal stacks made of, for example, an electroplated copper top layer, a copper seed middle layer, and a titanium bottom layer. The titanium bottom layer and the copper seed middle layer can be deposited with a physical vapor deposition (PVD) process and have a thickness of about 100 nm and about 500 nm, respectively. The electroplated copper top layer can have a thickness of about 7 μm. Initially, the metal stack can be "blanket deposited" (e.g., deposited so that it covers layer 210) and subsequently patterned using photolithography and etch operations to form the metal lines of the RDL. For example, a photoresist can be spin-coated over the metal stack and patterned so that openings are formed in the photoresist layer to expose areas of the metal stack. The exposed areas of the metal stack can be subsequently removed with a wet etch process. Areas of the metal stack covered by the photoresist will not be removed. In other words, the photoresist can act as a wet etch mask. The wet etch chemistry can remove the exposed areas of the metal stack until PBO layer 210 is exposed. After the wet etch operation, the photoresist can be removed leaving behind patterned areas of the metal stack, such as metal lines 300 and 310. In some embodiments, metal line 300 can be the bottom metal plate of an MIM capacitor. Metal line 310 may be a bottom plate of another MIM capacitor or a line that may electrically connect different elements within the packaging structure. In some embodiments, additional lines can be formed. Therefore, the bottom RDL may not be limited to metal lines 300 and 310.

Figure 4:
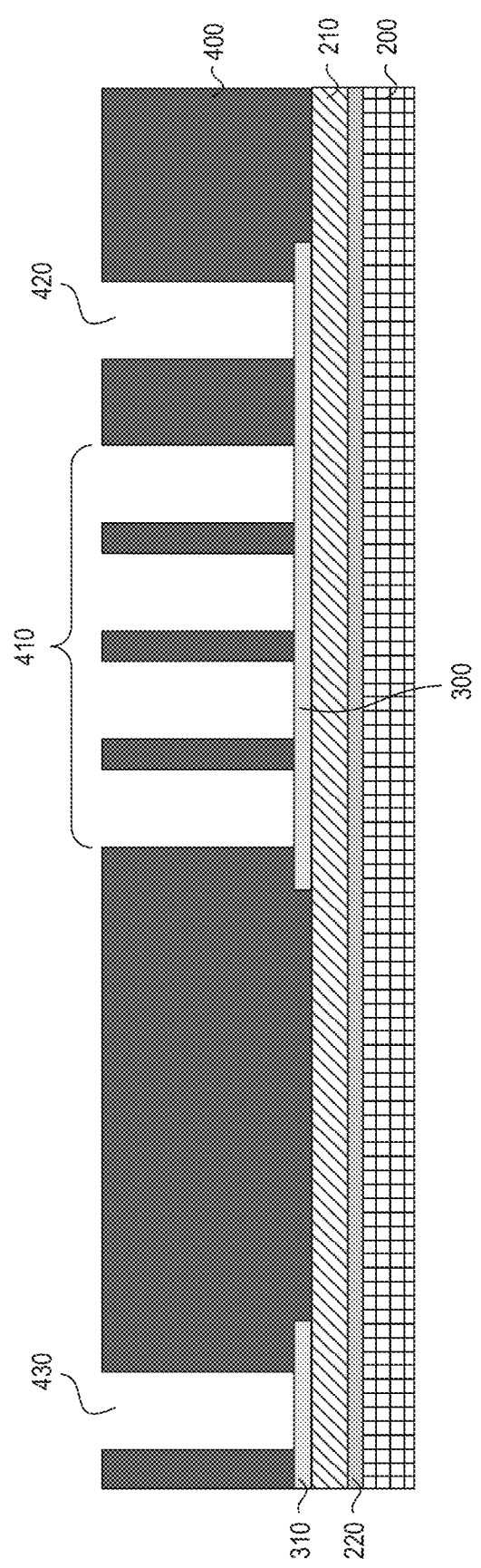
FIG. 4 is a cross-sectional view of a patterned photoresist layer over a redistribution layer (RDL), according to some embodiments.
Figure 5:
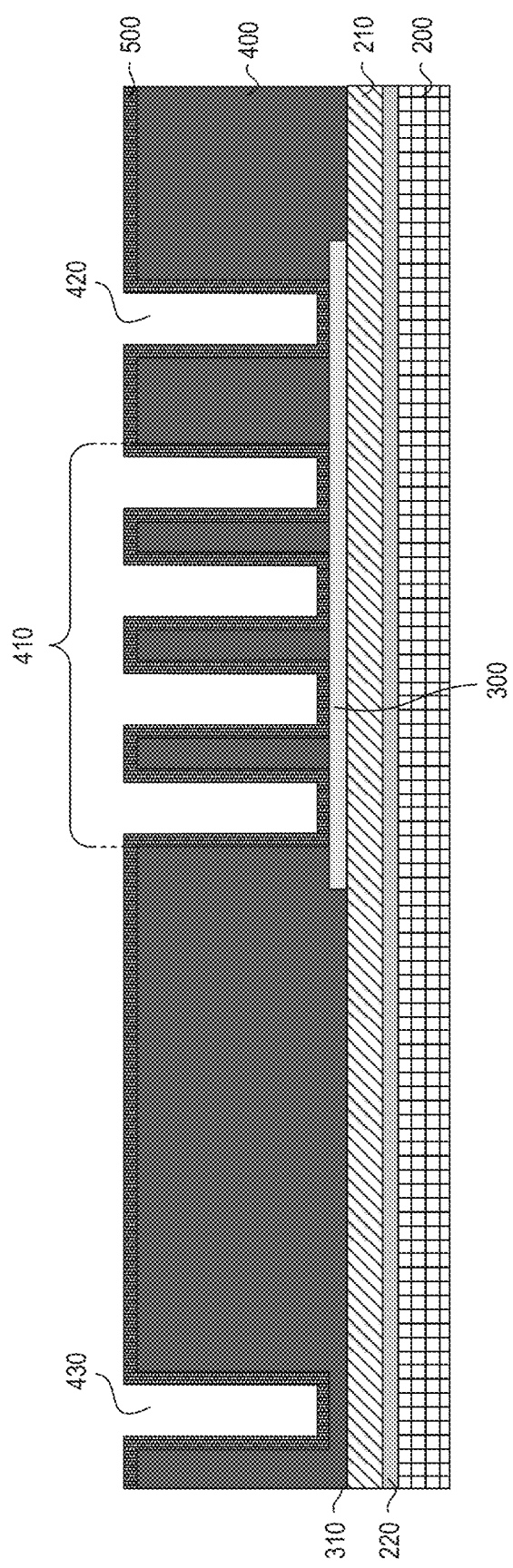
FIG. 5 is a cross-sectional view of a patterned photoresist layer over a redistribution layer (RDL) after a copper seed layer deposition, according to some embodiments.
Figure 6:
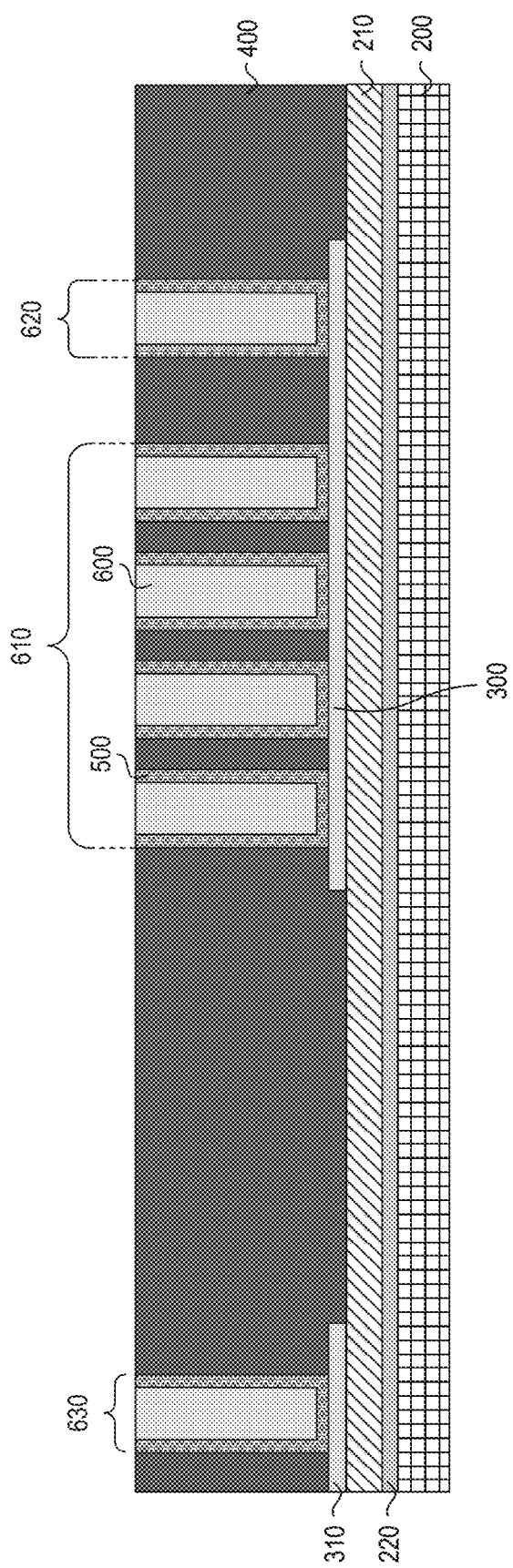
FIG. 6 is a cross-sectional view of a patterned photoresist layer over a redistribution layer (RDL) after a copper electroplating process and a subsequent chemical mechanical planarization (CMP) operation, according to some embodiments.

In operation 130 of exemplary fabrication method 100, one or more through interposer vias (TIVs) are formed on top of the bottom RDL (e.g., metal lines 300 and 310). By way of example and not limitation, the one or more TIVs can be formed using photolithography and etch operations. For example, referring to FIG. 4, a photoresist layer 400 with a thickness between about 180 μm to about 250 μm is spin-coated over metal lines 300, 310 and PBO layer 210. Photoresist 400 can be patterned to form openings 410 and 420 to expose a portion of metal line 300, and opening 430 to expose a portion of metal line 310. In some embodiments, openings 420 and 430 can have different widths than openings 410. For example, opening 410 can have a width of about 300 μm, and openings 420 and 430 can have a width of about 120 μm. In FIG. 5, a titanium and copper seed layer stack 500 is deposited with a PVD process over patterned photoresist layer 400 to cover the sidewalls and bottom surfaces of openings 410, 420, and 430. In some embodiments, seed layer stack 500 can be deposited over photoresist layer 400. In some embodiments, the titanium layer can be about 1000 Å and the copper seed layer can be about 5000 Å. In FIG. 6, copper layer 600 has been electroplated over the titanium and copper seed layer stack 500 in openings 410, 420, and 430 to form TIVs 610, 620, and 630 respectively. In some embodiments, the as-deposited copper layer 600 can grow over photoresist layer 400 and over seed layer stack 500. Copper layer 600 can be planarized with a chemical mechanical planarization (CMP) process that will remove portions of copper layer 600 over the top of photoresist layer 400. In some embodiments, seed layer stack 500 can be removed over photoresist layer 400 during the CMP process. The thickness of photoresist layer 400, which can range in some embodiments between about 180 μm to about 250 μm, may define the height of TIVs 610, 620, and 630.

Figure 7:
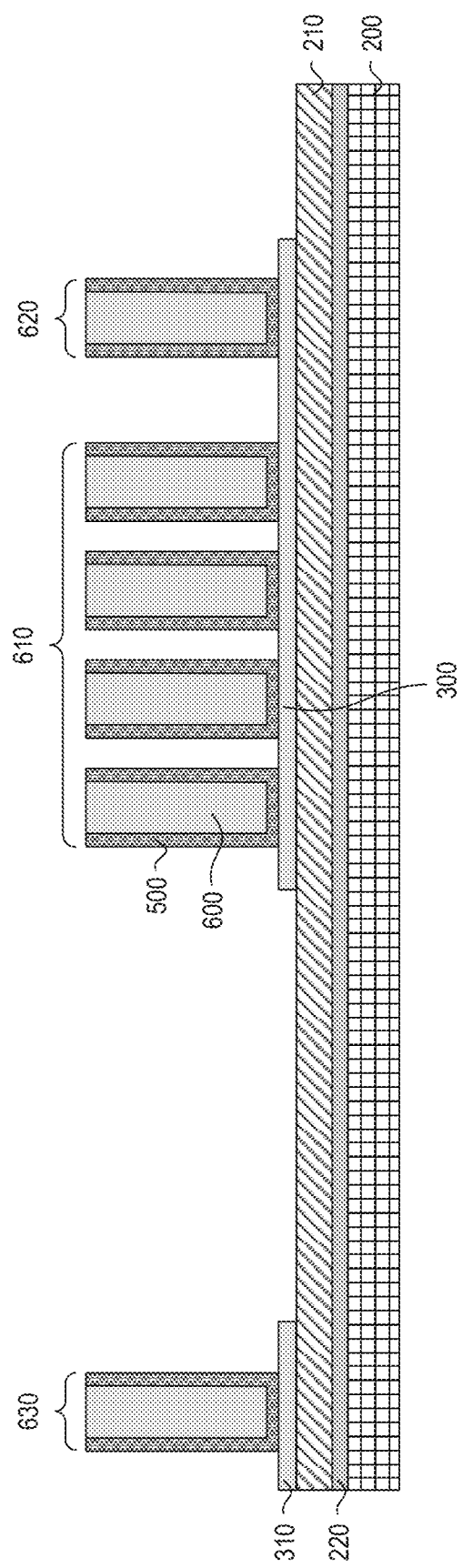
FIG. 7 is a cross-sectional view of a glass carrier wafer with a redistribution layer (RDL) and through interposer vias (TIVs) formed thereon, according to some embodiments.

After the formation of TIVs 610, 620, and 630, photoresist layer 400 can be removed with a wet etch as shown in FIG. 7. According to some embodiments, TIVs 620 and 630 can have different widths than TIVs 610. For example, TIVs 610 can have a width of about 300 μm and TIVs 620 and 630 can have a width of about 120 μm. In some embodiments, larger width TIVs 610 can be used as an integral part of an MIM capacitor structure—which are described below—while TIVs 620 and 630 can be used as electrical connections between layers within an InFO packaging. In some embodiments, the aspect ratio (width over height) of TIVs 610 can range from 1:2 to 1:1.2.

Figure 8:
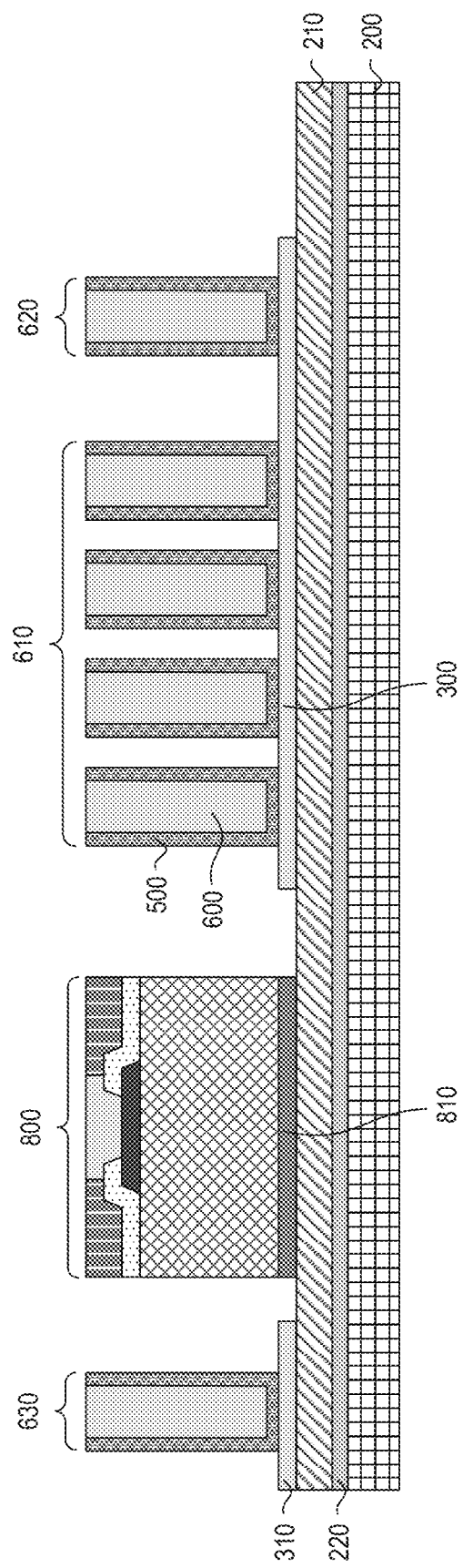
FIG. 8 is a cross-sectional view of a die attached to a top protective layer of a glass carrier, according to some embodiments.

In operation 140 and referring to FIG. 8, a die 800 is attached to PBO layer 210. In some embodiments, die 800 may have, for example, radio frequency communications functionality (RF die), or may have other or additional functions. Die 800 may have been pre-fabricated using chip fabrication processes and may include a plurality of transistors and multiple interconnect layers configured to implement its functionality (e.g., RF communications). In some embodiments, a die attach film (DAF) 810 can be used to attach die 800 on PBO layer 210. DAF 810 can have a thickness of about 10 μm according to some embodiments. In some embodiments, DAF 810 is not made of conductive material. By way of example and not limitation, the height of die 800 may be comparable to the height of TIVs 610, 620, and 630. According to some embodiments, more than one die can be attached to PBO layer 210 during operation 140.

Figure 9:
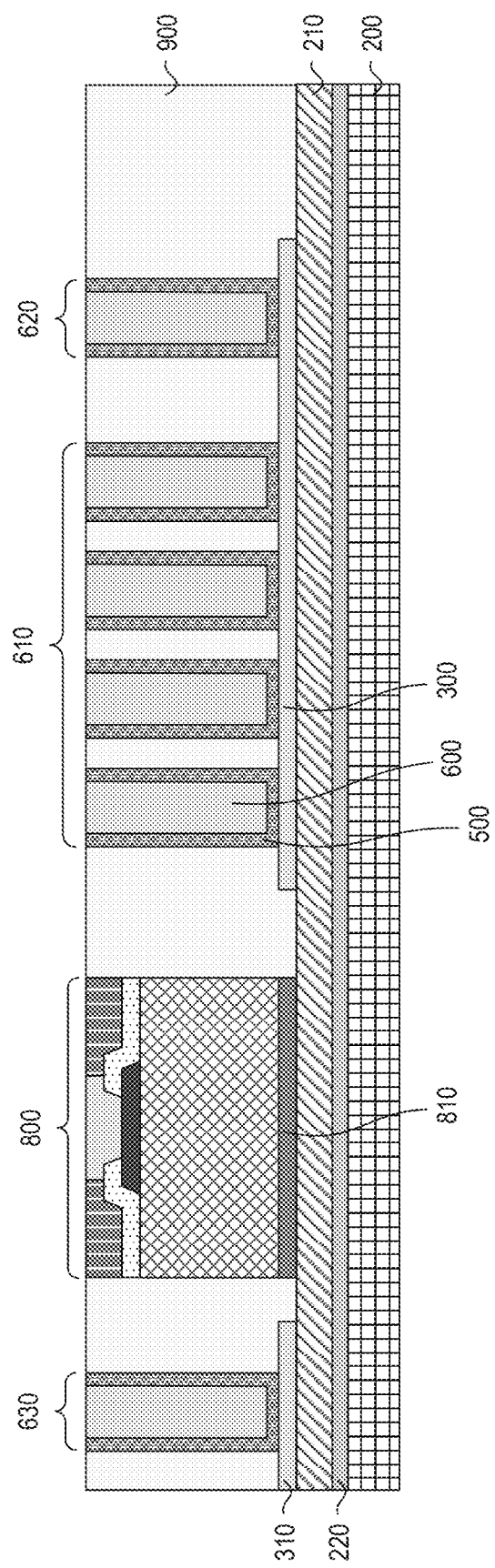
FIG. 9 is a cross-sectional view of a glass carrier with a redistribution layer (RDL), through interposer vias (TIVs), and a die thereon embedded in a molding compound, according to some embodiments.

In operation 150 and referring to FIG. 9, a molding compound (MC) 900 can be spin-coated over layer 210. According to some embodiments, molding compound 900 is an epoxy-based material that is a solid at room temperature and a liquid when heated at temperatures greater than 180° C. (e.g., between about 180° C. and about 200° C.). In some embodiments, molding compound 900 is melted before being spin-coated on PBO layer 210. According to some embodiments, die 800 and TIVs 610, 620 and 630 can become embedded in molding compound 900. By way of example and not limitation, the spin-coated molding compound can have a thickness between about 230 μm and about 300 μm. This means that the as-coated molding compound 900 can have an overburden of about 50 μm—for example, it may extend about 50 μm over the top surfaces of die 800 and TIVs 610, 620, and 630.

After the application of molding compound 900 on glass carrier 200, molding compound 900 can be left to cool and harden. Once molding compound 900 hardens, it can be partially grinded so that about 98% of the 50 μm overburden can be removed. The grinding process can leave the top surface of molding material compound 900 coarse. According to some embodiments, a CMP process can be subsequently used to planarize, polish, and remove the remaining portion of molding compound 900 (e.g., about 1 μm, which is the remaining 2% of the 50 μm overburden) until the top surfaces of die 800 and TIVs 610, 620, and 630 are exposed.

In some embodiments, molding compound 900 can provide structural support to die 800 and TIVs 610, 620, and 630. In some embodiments, molding compound 900 can provide structural support to the InFO packaging structure.

Figure 10:
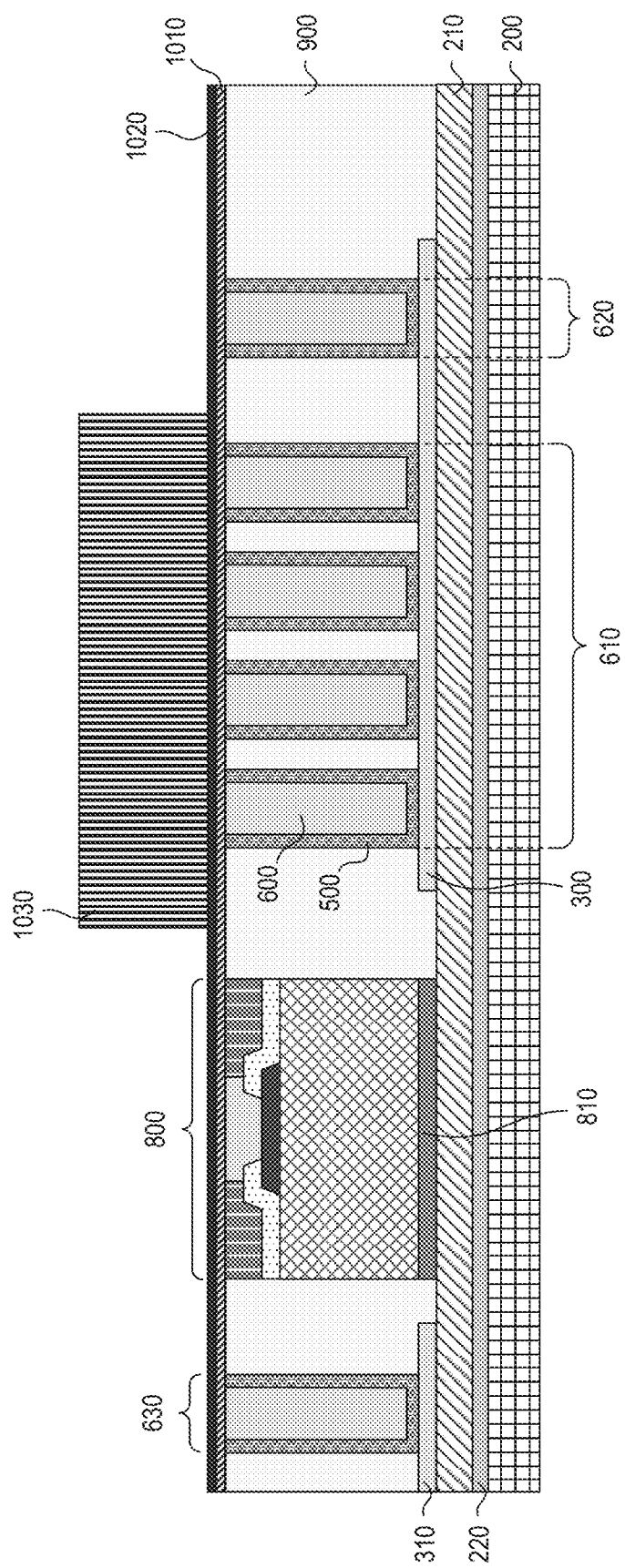
FIG. 10 is a cross-sectional view of a patterned photoresist layer over a metal/dielectric stack on a partially formed metal insulator metal (MIM) capacitor, according to some embodiments.

In operation 160 of exemplary fabrication method 100, a dielectric is formed over the one or more TIVs. In some embodiments, the dielectric layer is initially blanket deposited over molding compound 900, the TIVs (e.g., 610, 620, and 630), and die 800. The dielectric layer is subsequently patterned to form respectively an insulator for an MIM capacitor. Referring to FIG. 10, a dielectric layer 1010 is deposited as a blanket film over molding compound 900. In some embodiments, dielectric layer 1010 is deposited at a temperature below about 250° C.; for example, at about 180° C. or about 210° C. depending on the type of dielectric layer and the deposition method. Additionally, the thickness of dielectric layer 1010 can range from about 0.1 μm to about 10 μm depending on the dielectric constant (k-value) of the dielectric material and the targeted capacitance of the MIM capacitor. However, the aforementioned thickness ranges are exemplary and are not intended to be limiting.

By way of example and not limitation, dielectric layer 1010 is a high-dielectric constant (high-k) material. By way of example and not limitation, dielectric layer 1010 can have a k-value greater than 3.9 (e.g., equal to about 7) depending on the type of material. By way of example and not limitation, dielectric layer 1010 can be a silicon nitride ($SiN_x$) film with a k-value of about 7, deposited with a plasma-enhanced chemical vapor deposition (PECVD) process at a deposition temperature of about 180° C. and with a thickness greater than about 300 Å. In addition, dielectric layer 1010 can be silicon oxide ($SiO_2$) or silicon oxynitride ($SiON_x$) deposited with chemical vapor deposition (CVD), PECVD, atmospheric pressure CVD (APCVD), sub-atmospheric pressure CVD (SACVD), metal organic CVD (MOCVD), etc. In some embodiments, dielectric layer 1010 can be a dielectric stack—which may include a bottom layer of zirconium oxide ($ZrO_2$), a middle layer of aluminum oxide ($Al_2O_3$), a top layer of $ZrO_2$—that can be deposited at a temperature of about 210° C. and have a k-value greater than about 13 (e.g., 13.6). In some embodiments, dielectric layer 1010 can be a stack that includes hafnium-based dielectrics (e.g., hafnium oxide ($HfO_x$) and hafnium silicate ($HfSiO_x$)), titanium oxide ($TiO_2$), or tantalum oxide ($TaO_x$). Dielectric layer 1010 can also be a liquid phase high-k polymer, such as PBO or PI, that can be cured and hardened at a temperature below about 250° C. Dielectric layer 1010 can also be a spin on glass (SOG) or a liquid phase $SiO_2$ with a low curing temperature (e.g., below about 250° C.) and a k-value between about 4 and about 4.2. Additionally, dielectric layer 1010 can be strontium oxide ($SrTiO_3$) with a k-value between 100 and 200, barium-titanium oxide ($BaTiO_3$) with a k-value of about 500, barium-strontium-titanium oxide ($BaSrTiO_3$) with a k-value of between about 500 to 1000, or lead-zirconium-titanium oxide ($PbZrTiO_3$) with a k-value of about 1000.

In some embodiments, dielectric layer 1010 can be a high-k dielectric material (e.g., k>3.9) that can be deposited with a PVD, a CVD, a PECVD, an APCVD, an SACVD, an MOCVD, or a CVD-based deposition process at a deposition temperature below about 250° C. (e.g., 180° C. or 210° C.). Alternatively, in some embodiments, dielectric layer 1010 can be a high-k dielectric material with a dielectric constant higher than about 3.9 that can be spin-coated at a temperature below about 250° C. (e.g., 180° C. or 210° C.).

According to some embodiments, for a fixed capacitance of the MIM capacitor, the thickness of dielectric layer 1010 can be larger for dielectric materials with higher k-value. In addition, higher-k value materials can provide higher capacitance values for the MIM structure that has a fixed distance and area between the capacitor's plates according to the following parallel plate capacitance formula:

$$C = k\varepsilon_o \frac{A}{d}$$

where C is the capacitance of the MIM structure, k is the dielectric constant of the insulator in the MIM structure (e.g., the dielectric constant of dielectric layer 1010), $\varepsilon_0$ is the dielectric constant of free space, A is area of the plates in the MIM structure, and d is the distance between the plates of the MIM structure (e.g., the thickness of dielectric layer 1010).

In operation 170 of FIG. 1, and referring to FIG. 10, a metal layer 1020 is deposited as a blanket film on dielectric layer 1010. In some embodiments, metal layer 1020—when patterned—can form a top metal plate of an MIM capacitor structure. Metal layer 1020, similar to metal lines 300 and 310, is a metal stack made of electroplated copper top layer, a copper seed middle layer, and a titanium bottom layer. The titanium bottom layer and the copper seed middle layer can be deposited with a PVD process at a thickness of about 100 nm and 500 nm, respectively. The electroplated copper top layer can have a thickness of about 7 µm.

Figure 11:
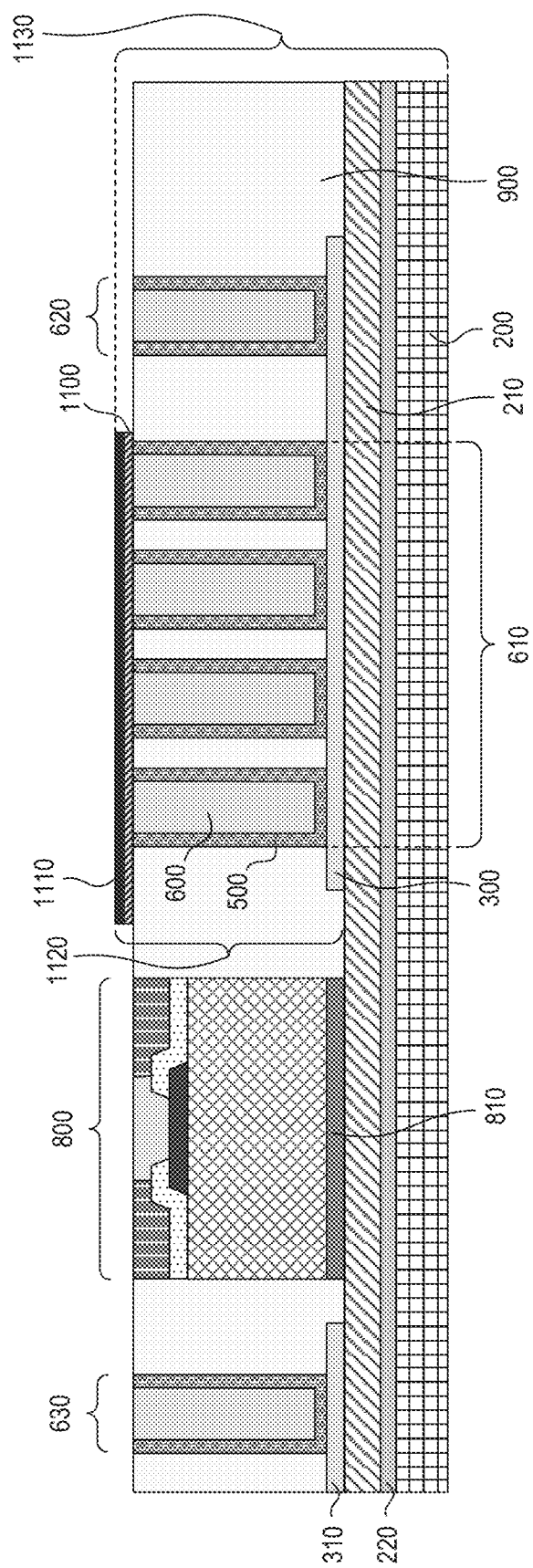
FIG. 11 is a cross-sectional view of a metal insulator metal (MIM) capacitor over a glass carrier, according to some embodiments.

Photolithography and etch operations can be used to pattern metal layer 1020 and dielectric layer 1010. For example, a photoresist can be spin-coated over the metal stack and subsequently patterned so that a "block" of photoresist 1030 is formed over TIVs 610 as shown in FIG. 10. Patterned photoresist 1030 can be aligned to TIVs 610. A wet etch process can remove portions of metal layer 1020 not covered by patterned photoresist 1030, and a subsequent dry etch process can remove portions of dielectric layer 1010 not covered by patterned photoresist 1030. FIG. 11 shows patterned dielectric layer 1100 and patterned metal layer 1110 after the removal process of patterned photoresist 1030. According to some embodiments, metal line 300, patterned dielectric layer 1100, patterned metal layer 1110, and TIVs 610 can form the elements of MIM capacitor 1120. According to some embodiments, metal line 300 and patterned metal layer 1110 can have thicknesses of about 7 µm.

By way of example and not limitation, MIM capacitor 1120, as depicted in FIG. 11, includes four TIVs structures. However, fewer or additional TIVs with a width of about 300 µm can be possible. In some embodiments, the number of TIVs is proportional to the capacitance of MIM capacitor 1120. For example, a fewer number of TIVs 610 can result in lower capacitance for MIM capacitor 1120 (due to smaller capacitor plate area A), and conversely, a larger number of TIVs 610 can result in higher capacitance for MIM capacitor 1120 (due to larger capacitor plate area A). In some embodiments, TIV 620 can be used to electrically connect metal line 300 (bottom plate of MIM capacitor 1120) to an external ground connection.

In operation 180 of exemplary method 100, additional RDLs may be formed on top of interposer structure 1130 to add electrical connections to metal layer 1110, bottom RDL, and die 800 according to some embodiments. In some embodiments, each additional RDL is formed over a new PBO or PI layer, like PBO layer 210. For example, referring to FIG. 12, a PBO layer 1200—which is similar to PBO layer 210—is disposed over stack 1130. PBO layer 1200 can be subsequently patterned to form openings therein where the RDL metal lines will be formed. For example, in FIG. 12, a first RDL 1210 can be formed over TIVs 630 and 620, die 800, and metal layer 1110. The alignment of first RDL 1210 with the elements of stack 1130 (e.g., TIVs 630 and 620, die 800, and metal layer 1110) can be achieved using one or more photolithography and etch operations (e.g., use of photoresist patterning). By way of example and not limitation, a photoresist layer can be spin-coated over PBO layer 1200. The photoresist layer can be patterned so that openings aligned to TIVs 630 and 620, die 800, and metal layer 1110 can be formed in the photoresist layer. An etch process can remove a portion of PBO layer 1200 through the openings in the photoresist to form openings in PBO layer 1200 aligned to TIVs 630 and 620, die 800, and metal layer 1110. Subsequently, the photoresist layer can be removed and a blanket metal stack can be deposited and patterned to form the lines of first RDL 1210.

Figure 12:
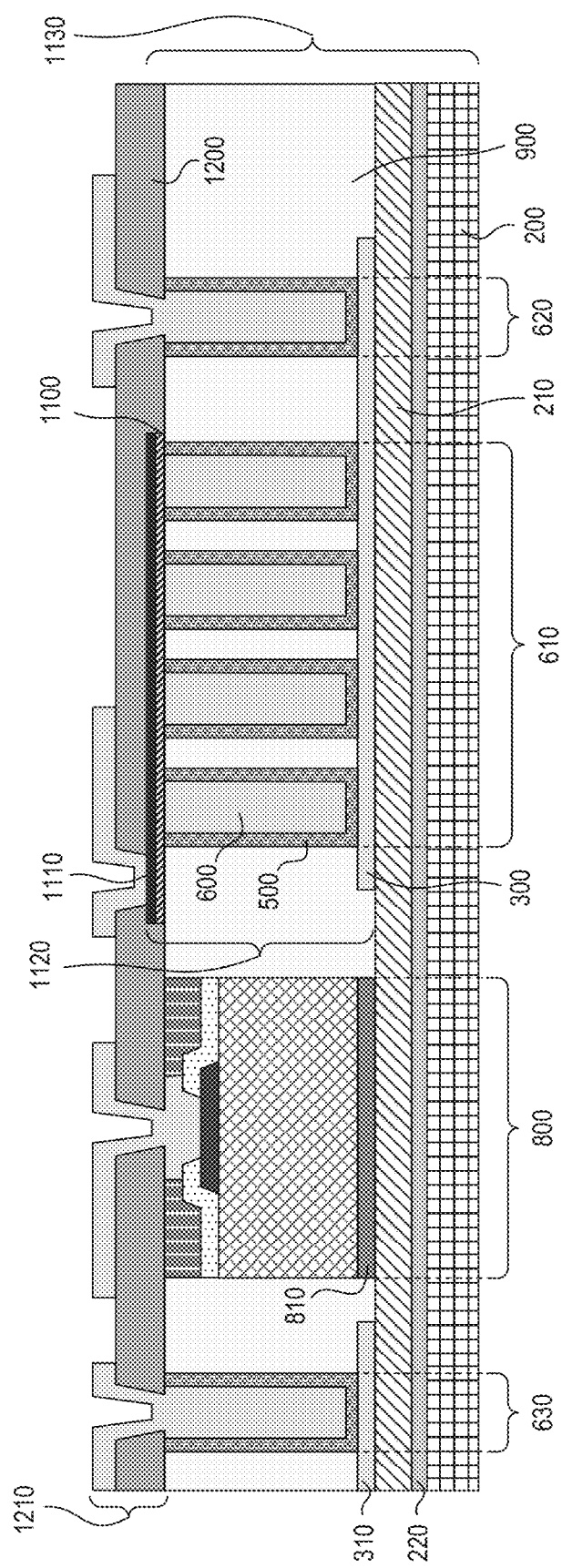
FIG. 12 is a cross-sectional view of a redistribution layer (RDL) on a metal insulator metal (MIM) capacitor over a glass carrier, according to some embodiments.

The lines of first RDL 1210 can be made of the same material as metal layer 1110 and metal lines 300, 310 (e.g., a metal stack made of electroplated copper top layer, a copper seed middle layer, and a titanium bottom layer). The titanium bottom layer and the copper seed middle layer can be deposited with a PVD process at a thickness of about 100 nm and 500 nm, respectively. The electroplated copper top layer can have a thickness of about 7 µm. In some embodiments, the metal stack may partially fill the openings in PBO layer 1200 as shown in FIG. 12.

Figure 13:
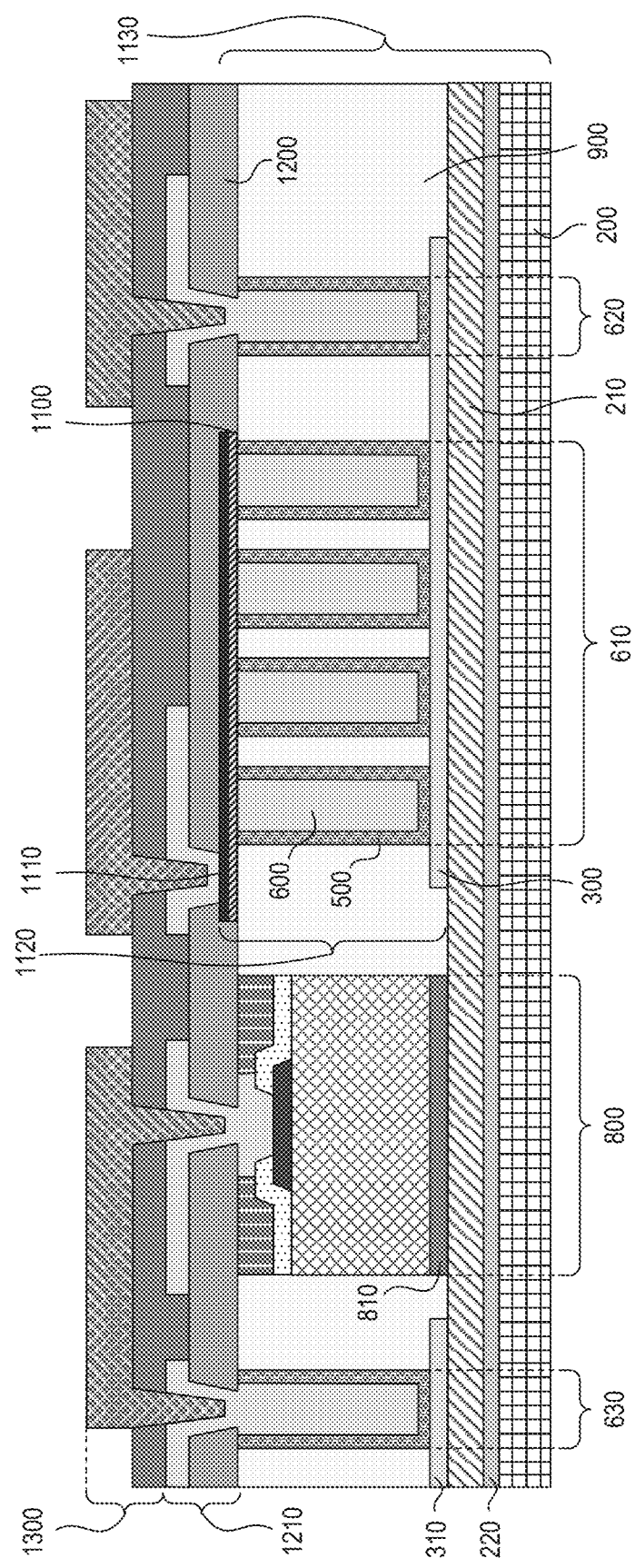
FIG. 13 is a cross-sectional view of two redistribution layers (RDL) on a metal insulator metal (MIM) capacitor over a glass carrier, according to some embodiments.
Figure 14:
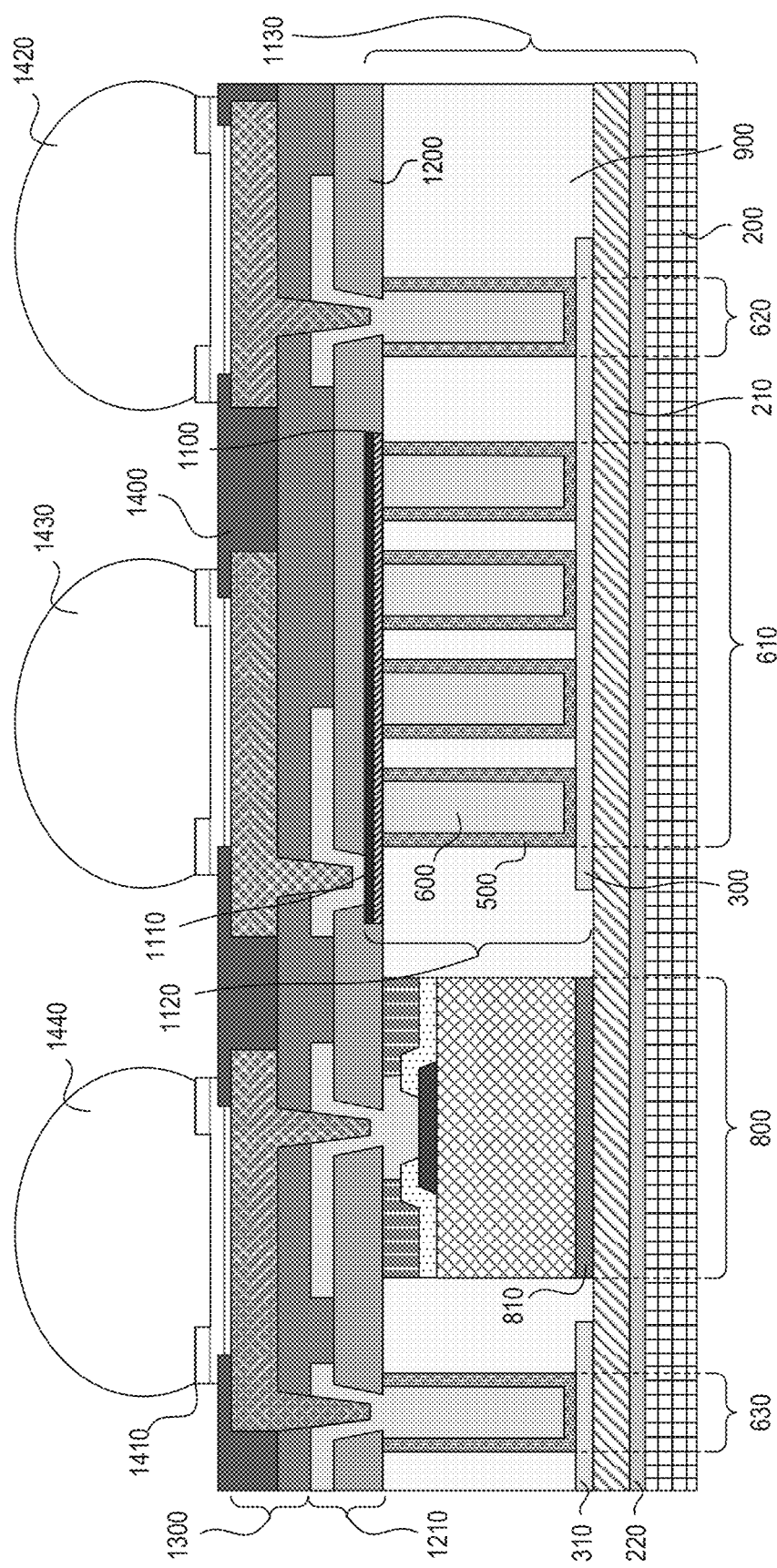
FIG. 14 is a cross-sectional view of integrated fan-out (InFO) packaging structure with an integrated metal insulator metal (MIM) capacitor over a glass carrier, according to some embodiments.

The above operation can be successively repeated to form a second RDL 1300, as shown in FIG. 13. The number of RDL levels provided herein are exemplary and should not be considered limiting. Therefore, fewer or additional RDL levels may be formed depending on the InFO packaging design. In FIG. 14, a PBO layer 1400 is disposed over second RDL 1300 and subsequently patterned. According to some embodiments, a subsequent metal deposition and patterning can form under bump metallurgy (UBM) contacts 1410. UBM contacts 1410 can be an interface between RDL 1300 and solder bumps 1420, 1430, and 1440. In some embodiments, UBM contacts 1410 can be an alloy made of titanium (Ti) and copper (Cu), titanium (Ti)-tungsten (W) and copper (Cu), aluminum (Al)-nickel (Ni)-vanadium (V) and copper (Cu), or chromium (Cr) and copper (Cu). Solder bumps 1420, 1430, and 1440 can be part of a ball grid array (BGA) and can be made of a metal alloy that may contain tin (Sn), silver (Ag) and copper (Cu), or a metal alloy that may contain lead (Pb) and tin (Sn).

In some embodiments, glass carrier 200 can be detached (released) from PBO layer 210. For example, irradiation of LTHC 220 with a focused laser beam, through the back-side of glass carrier substrate 200, can generate sufficient heat to decompose LTHC 200 and release glass carrier substrate 200 from PBO layer 210. PBO layer 210 is referred to as "a backside PBO" and can act as a protective layer for the InFO packaging.

Figure 15:
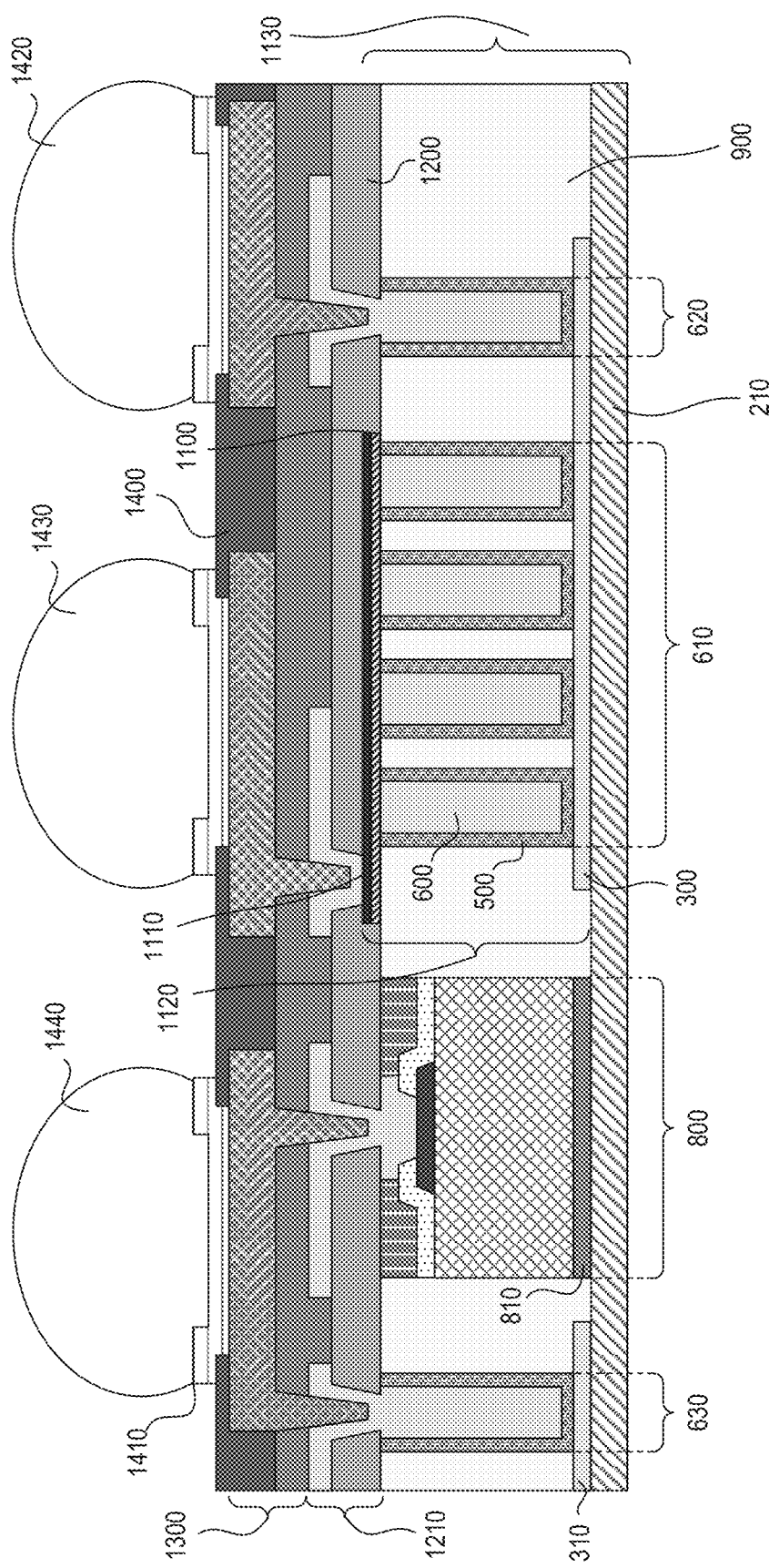
FIG. 15 is a cross-sectional view of integrated fan-out (InFO) packaging structure with an integrated metal insulator metal (MIM) capacitor after a glass carrier has been separated, according to some embodiments.

In some embodiments, solder bump 1420—which is electrically connected to line 300 through TIV 620—can be connected to an external ground connection, and solder bump 1430—which is electrically connected to patterned metal layer 1110—can be electrically connected to an external power supply (e.g., a positive voltage) applied to the top metal plate of MIM capacitor 1120. In some embodiments, solder bump 1440—which is electrically connected to die 800—can be electrically connected to an external power supply that provides an input signal to die 800. The number of solder bumps shown in FIG. 15 are not limiting and, therefore, fewer or additional solder bumps can be possible.

According to some embodiments, solder bumps can electrically connect the InFO packaging to one or more external power supplies or to a ground connection. An external power supply is a power supply that is not integrated into the InFO fabrication process, according to some embodiments. For example, the InFO packaging with MIM capacitor 1120 can be attached through solder bumps 1420, 1430, and 1440 to a die or a printed circuit board (PCB) with solder bumps receptors. The attached die or PCB can provide power signals to MIM capacitor 1120.

According to some embodiments, MIM capacitors, such as MIM capacitor 1120, with high dielectric constant dielectric layer 1100 may include fewer TIVs 610 (e.g., have smaller electrode plate area A) compared to an MIM capacitor with a lower dielectric constant dielectric layer 1100 but nominally similar capacitance according to the following parallel plate capacitance formula:

$$C = k\varepsilon_o \frac{A}{d}$$

In some embodiments, the capacitance of an MIM capacitor, which is formed with exemplary method 100, can range from about 50 nF to about 0.547 nF. However, this range is not limiting. By way of example and not limitation, the capacitance of the MIM capacitor formed with exemplary method 100 can be tuned via the dielectric constant of dielectric layer 1100 (e.g., k-value), the number of TIVs 610 (e.g., the capacitor's electrode plate area A), the height of TIV's 610 (e.g., the capacitor's plate spacing d), or a combination thereof.

The present disclosure is directed to a method of forming an MIM decoupling capacitor which can be integrated (or embedded) into a 3D IC packaging such as, for example, a CoWoS and an InFO packaging. Integration of the MIM decoupling capacitor into the packaging structure can reduce the interconnect length and the packaging size. According to some embodiments, the MIM decoupling capacitor may include a variety of dielectric materials with different dielectric constants. In addition, the MIM capacitor may have different capacitor plate areas. As a result, the MIM capacitor formed with the method described in the present disclosure may exhibit a range of capacitance values. Further, compared to decoupling capacitors mounted on a substrate using the SMT technology, an integrated MIM capacitor in a CoWoS or an InFO packaging—according to the embodiments described herein—can (i) reduce time delay due to a shorter interconnect length, (ii) offer higher capacitance and a larger capacitance range, (iii) reduce power consumption, (iv) improve operational speed, and (v) reduce the 3D IC packaging size.

In some embodiments, a method of forming an interposer structure includes providing a carrier substrate with a protective layer thereon and forming a capacitor on the protective layer, where forming the capacitor includes the following operations. Depositing a bottom metal layer with a redistribution layer on a portion of the protective layer, depositing a photoresist layer over the bottom metal layer, etching the photoresist layer to form TIV openings in the photoresist, where the TIV openings expose respective portions of the bottom metal layer. Further, forming the capacitor includes depositing a metal stack in the TIV openings to form TIVs, remove the photoresist layer, dispose a molding compound between the TIVs, deposit a dielectric layer on the molding compound and the TIVs, and deposit a top metal layer on the dielectric layer to form a capacitor with a capacitance that is based on (i) a dielectric constant of the dielectric layer, (ii) a number of the TIVs, and (iii) a thickness of the molding compound.

In some embodiments, an interposer structure includes a protective layer, a first redistribution layer over the protective layer, a capacitor structure over the first redistribution layer, a die attached over the protective layer, a molding compound that surrounds the die and the one more TIVs of the capacitor structure, and a second redistribution layer over the die and the capacitor structure The capacitor structure further includes a bottom metal layer, one or more through interpose vias (TIVs) on the bottom metal layer, a dielectric material on the one or more TIVs, and a top metal layer on the dielectric material.

In some embodiments, a system includes a first redistribution layer that includes solder bumps, an interposer structure electrically connected to the first redistribution layer, one or more first dies and one or more second dies electrically connected to the first redistribution layer via the solder bumps. The interposer structure further includes a capacitor structure which includes a bottom metal layer, one or more through interpose vias (TIVs) on the bottom metal layer, a dielectric material on the one or more TIVs, and a top metal layer on the dielectric material. The interposer structure further includes one or more dies and a molding compound layer that surrounds the one or more dies and the TIVs of the capacitor structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method of forming an interposer structure, the method comprising:
   providing a carrier substrate with a protective layer thereon; and
   forming a capacitor on the protective layer, wherein the forming the capacitor comprises:
   depositing a bottom metal layer on a portion of the protective layer, wherein the bottom metal layer comprises a redistribution layer;
   depositing a photoresist layer over the bottom metal layer;
   etching the photoresist layer to form through interposer via (TIV) openings in the photoresist, wherein the TIV openings expose respective portions of the bottom metal layer;
   depositing a metal stack in the TIV openings to form TIVs;
   removing the photoresist layer;

disposing a molding compound between and in physical contact with each of the TIVs;
depositing a dielectric layer on the molding compound and the TIVs, wherein the dielectric layer is spaced apart from the bottom metal layer; and
depositing a top metal layer on the dielectric layer to form the capacitor.

2. The method of claim 1, further comprising:
attaching one or more dies over the protective layer.

3. The method of claim 2, further comprising:
disposing a first redistribution layer over the capacitor and the one or more dies to form electrical connections to the top metal layer and to the one or more dies;
disposing a second redistribution layer over the first redistribution layer;
attaching solder bumps to the second redistribution layer;
attaching a printed circuit board to the solder bumps; and
removing the carrier substrate.

4. The method of claim 1, wherein the dielectric layer comprises silicon nitride ($SiN_x$), silicon oxide ($SiO_2$), silicon oxynitride ($SiON_x$), hafnium oxide ($HfO_x$), hafnium silicate ($HfSiO_x$), titanium oxide ($TiO_2$), tantalum oxide ($TaO_x$), polybenzoxazole (PBO), polyimide (PI), spin on glass (SOG), liquid phase silicon oxide ($SiO_2$), strontium oxide ($SrTiO_3$), barium-titanium oxide ($BaTiO_3$), barium-strontium-titanium oxide ($BaSrTiO_3$), lead-zirconium-titanium oxide ($PbZrTiO_3$), or combinations thereof.

5. The method of claim 1, wherein depositing the dielectric layer comprises depositing the dielectric layer by a chemical vapor deposition (CVD), a plasma enhanced chemical vapor deposition (PECVD), an atmospheric pressure chemical vapor deposition (APCVD), a sub-atmospheric pressure chemical vapor deposition (SACVD), or a metal organic chemical vapor deposition (MOCVD) process.

6. The method of claim 1, wherein the dielectric layer comprises a bottom layer of zirconium oxide ($ZrO_2$), a middle layer of aluminum oxide ($Al_2O_3$), and a top layer of zirconium oxide ($ZrO_2$).

7. The method of claim 1, wherein the capacitance of the capacitor ranges from 0.5 nF to 50 nF.

8. The method of claim 1, wherein the dielectric layer has a dielectric constant greater than 3.9.

9. An interposer structure, comprising:
a protective layer;
a first redistribution layer over the protective layer;
a capacitor structure over the first redistribution layer, wherein the capacitor structure comprises:
a bottom metal layer;
one or more through interpose vias (TIVs) on the bottom metal layer;
a dielectric material on the one or more TIVs, wherein the dielectric material is spaced apart from the bottom metal layer; and
a top metal layer on the dielectric material; and
a die attached over the protective layer;
a molding compound surrounding the die and each of the one or more TIVs of the capacitor structure, wherein the molding compound is in physical contact with each of the one or more TIVs; and
a second redistribution layer over the die and the capacitor structure.

10. The interposer structure of claim 9, wherein the second redistribution layer comprises electrical contacts to the die, the top metal layer of the capacitor structure, and the bottom metal layer of the capacitor structure.

11. The interposer structure of claim 10, further comprising:
a third redistribution layer over the second redistribution layer; and
solder bumps over the third redistribution layer configured to electrically connect to the bottom and top metal layers of the capacitor structure.

12. The interposer structure of claim 9, wherein the TIVs have an aspect ratio between 1:2 and 1:1.2.

13. The interposer structure of claim 9, wherein the dielectric material has a dielectric constant between 3.9 and 1000.

14. The interposer structure of claim 9, wherein a capacitance of the capacitor structure ranges from 0.5 nF to 50 nF.

15. The interposer structure of claim 14, wherein the capacitance of the capacitor structure is based on a dielectric constant of the dielectric material, a number of the TIVs, and a height of the TIVs.

16. A system, comprising:
a first redistribution layer comprising solder bumps;
an interposer structure electrically connected to the first redistribution layer and comprising:
a capacitor structure comprising:
a bottom metal layer;
one or more through interpose vias (TIVs) on the bottom metal layer;
a dielectric material on the one or more TIVs, wherein the dielectric material is spaced apart from the bottom metal layer; and
a top metal layer on the dielectric material;
one or more first dies; and
a molding compound layer surrounding the one or more dies and the one or more TIVs of the capacitor structure, wherein the molding compound is in physical contact with each of the one or more TIVs; and
one or more second dies electrically connected to the first redistribution layer via the solder bumps.

17. The system of claim 16, wherein the one or more TIVs have an aspect ratio between 1:2 and 1:1.2.

18. The system of claim 16, wherein the dielectric material has a dielectric constant between 3.9 and 1000.

19. The system of claim 16, wherein a capacitance of the capacitor structure ranges from 0.5 nF to 50 nF.

20. The system of claim 19, wherein the capacitance of the capacitor structure is based on a dielectric constant of the dielectric material, a number of the TIVs, and a height of the TIVs.

* * * * *